United States Patent
Schmitt

(10) Patent No.: US 6,745,930 B2
(45) Date of Patent: Jun. 8, 2004

(54) METHOD OF ATTACHING A BODY MADE OF METAL MATRIX COMPOSITE (MMC) MATERIAL OR COPPER TO A CERAMIC MEMBER

(75) Inventor: Theodore Nicolas Schmitt, Vienna (AT)

(73) Assignee: Electrovac, Fabrikation elektrotechnischer Spezialartikel Ges.m.b.H., Klosterneuburg (AT)

( * ) Notice: Subject to any disclaimer, the term of this patent is extended or adjusted under 35 U.S.C. 154(b) by 143 days.

(21) Appl. No.: 10/079,084

(22) Filed: Feb. 19, 2002

(65) Prior Publication Data

US 2002/0130161 A1 Sep. 19, 2002

Related U.S. Application Data

(63) Continuation of application No. PCT/AT00/00250, filed on Sep. 20, 2000.

(30) Foreign Application Priority Data

Nov. 17, 1999 (AT) ................................................ 1946/99

(51) Int. Cl.⁷ ................................................ B23K 31/02
(52) U.S. Cl. ..................................... 228/122.1; 228/254
(58) Field of Search .......................... 228/122.1, 123.1, 228/124.1, 124.5, 254, 245, 246, 256, 219, 221

(56) References Cited

U.S. PATENT DOCUMENTS

| 4,611,745 A | | 9/1986 | Nakahashi et al. | |
| 4,729,504 A | | 3/1988 | Edamura | |
| 4,992,110 A | * | 2/1991 | Tartaglia et al. | 148/552 |
| 5,040,588 A | * | 8/1991 | Newkirk et al. | 164/97 |
| 5,100,049 A | * | 3/1992 | Divecha et al. | 228/198 |
| 5,163,499 A | * | 11/1992 | Newkirk et al. | 164/98 |
| 5,188,164 A | * | 2/1993 | Kantner et al. | 164/97 |
| 5,260,137 A | * | 11/1993 | Rosenthal et al. | 428/608 |
| 5,425,494 A | * | 6/1995 | Rosenthal et al. | 228/124.5 |
| 5,455,118 A | * | 10/1995 | Cook | 428/555 |
| 5,465,481 A | * | 11/1995 | Romero | 29/840 |
| 5,618,635 A | * | 4/1997 | Newkirk et al. | 428/614 |
| 6,245,442 B1 | * | 6/2001 | Towata et al. | 428/614 |
| 6,328,198 B1 | * | 12/2001 | Ohashi et al. | 228/194 |
| 6,679,157 B2 | * | 1/2004 | Chu et al. | 89/36.02 |
| 2002/0130161 A1 | * | 9/2002 | Schmitt | 228/124.1 |

FOREIGN PATENT DOCUMENTS

| EP | 049 007 A1 | 4/1982 |
| EP | 085 914 A2 | 8/1983 |
| EP | 115 158 A2 | 8/1984 |
| EP | 0 363 286 A | 4/1990 |
| EP | 0 455 229 A | 11/1991 |
| EP | 0 839 598 A | 5/1998 |

OTHER PUBLICATIONS

Patent Abstracts of Japan vol. 1996, No. 11, Nov. 29, 1996, & JP 08 191120 A (Hitachi Ltd), Jul. 23, 1996, abstract.
W. Hufnagel: "Aluminium Taschenbuch" 1983, Aluminium Verlag, Dösseldorf, DE XP002164300, p. 607–p. 618.

* cited by examiner

Primary Examiner—Kiley Stoner
(74) Attorney, Agent, or Firm—Henry M. Feiereisen

(57) ABSTRACT

The invention relates to a method for attaching a first body which is of one of a metal matrix composite (MMC)-material or copper to a second body which is a ceramic member for acting as a heat sink, wherein the surface of the ceramic member which is placed against the MMC- or copper body is coated with a first metal by heating the two bodies to above the eutectic temperature of a system comprised of the matrix metal of the MMC-body or the copper of the copper body and the first metal applied to the surface of the ceramic member; and subsequently cooling the system to room temperature.

25 Claims, 1 Drawing Sheet

METHOD OF ATTACHING A BODY MADE OF METAL MATRIX COMPOSITE (MMC) MATERIAL OR COPPER TO A CERAMIC MEMBER

CROSS-REFERENCES TO RELATED APPLICATIONS

This application is a continuation of prior filed co-pending PCT International application no. PCT/AT00/00250, filed Sep. 20, 2000.

This application claims the priority of Austrian Patent Application Serial No. 1946/99, filed Nov. 17, 1999, the subject matter of which is incorporated herein by reference.

BACKGROUND OF THE INVENTION

The present invention relates to a method of attaching a body, in particular a heat sink, made of metal matrix composite (MMC) material or copper to a ceramic member, in particular a ceramic circuit board, wherein the ceramic member has a surface which is coated with a metal layer and bears upon the MMC body or the copper body.

In the following description, the term "MMC" or metal matrix composite" will denote a material which is comprised of two components. The first of these components is a metal, also designated as matrix metal. The second component is a reinforcement material which is embedded in the matrix metal and predominantly made of a ceramic material in a wide variety of material configurations, such as for example particles, fibers or coarser pieces or in the form of a singular piece or few single-piece parts of porous material. In either case, the matrix metal surrounds or permeates the reinforcement material to realize a good mixture of both components.

Composite materials of this type exhibit especially desirable properties such as for example, a high degree of mechanical strength, good heat conductivity, good resistance against temperature fluctuations, a low expansion coefficient, and the like. The extent to which certain compositions of these composite materials exhibit those afore-described properties and the actual values of their mechanical strength, heat conductivity or others can thus be controlled. Accordingly, a matrix metal material composite (MMC) can be manufactured based on the choice of these properties by selecting a particular matrix metal and a particular reinforcement material in a given ratio.

As the present invention is not directed to the fabrication of MMC materials and the artisan is aware of methods as to the manner of producing MMC materials, a detailed description of particular production methods for MMC materials is omitted for the sake of simplicity.

Such MMC-material bodies find many applications and are used in a great variety of fields and industries. One of the many applications of MMC-bodies is in the field of electric/electronic circuits, where MMC-bodies are used as heat sinks for electric/electronic circuits, in particular also circuit boards, to provide a cooling function. By attaching the MMC-bodies to the printed circuit board of the electric/electronic circuit to be cooled they effect the desired cooling function.

Circuit boards for electronic circuitry, which include for example high capacity unit components such as for example, rectifying circuits, which also comprise IGBTs that are utilized for providing direct current for direct current machines are produced increasingly from ceramic material. In general, the strip conductors that are attached on the printed circuit board are made from copper and are attached to the circuit board surface preferably by means of a Direct Copper Bonding process (DCB-process).

In accordance with the prior art, attachment of a heat sink of MMC material to the ceramic circuit board is carried out by a soldering process, whereby the ceramic circuit board is soldered together with the heat sink. To carry out this process, the surface of the ceramic member that is placed adjacent at the MMC-body of the heat sink is coated with a metal, which can be soldered to the matrix metal of the heat sink. Normally, this metal is copper. Subsequently, the MMC heat sink and the metal-coated ceramic circuit board are being attached to each other by means of solder.

Use of solder for so attaching an MMC-body to the ceramic substrate has however considerable drawbacks. For example, the soldering process requires the use of additional material and furthermore, the solder has to be introduced into the space between the two bodies that are to be attached which, from a production-technical viewpoint, requires an additional production step. Another drawback is that solder, generally known to be a low thermal conductor thereby prevents an optimal heat flow to the heat sink. The following are examples showing the heat conductivity of various solders: Au80Sn20=58W/mK; Au88Ge12=44W/mK; Sn66Pb36Ag2=54W/mkK.

Furthermore, solder compounds that are conventionally used for the attachment of heat sinks onto ceramic substrates contain lead, which presents a health hazard to those working in the production line due to their exposure to the toxic vapors that develop when applying the solder, in addition to also presenting a general threat to the environment.

Aside from the afore-described drawbacks, a further drawback of the method known in the prior art is that the attachment of a copper body or, respectively a copper layer onto a ceramic substrate in particular on a substrate of aluminum nitride has been unsatisfactory.

It would therefore be desirable and advantageous to provide an improved method to obviate the above-stated shortcomings and to provide a method by which an attachment of a body formed from MMC-material or from copper onto a ceramic member can be realized, which is technically simple to carry out and, at the same time, has environment-friendly properties.

SUMMARY OF THE INVENTION

According to one aspect of the present invention, a method is provided for attachment of a body made from an MMC-material or from copper to a ceramic substrate that includes that the ceramic member is coated with a first metal layer and then placed on the body of MMC-material or on the copper body so that the ceramic substrate is resting with the first metal layer against the MMC-body or the copper body. The matrix metal of the MMC-body, respectively the copper body and the first metal of the ceramic substrate member are then heated above the eutectic temperature of a system formed from the matrix metal of the MMC-body, respectively the copper-body, and the first metal of the ceramic substrate and subsequently cooled to room temperature whereby an intimate bond is formed between the ceramic member and the MMC-body respectively the copper body.

Advantageously, the method according to the invention of attaching a body of MMC-material or of copper to a ceramic substrate without the use of any solder whatsoever avoids all shortcomings and drawbacks associated with a soldering process.

It is a further advantage of the method according to the invention that the bond between the MMC body, respectively the copper body, and the ceramic member form a eutectic bond, which is of greater stability than a bond formed merely by solder. Moreover, the bond of this type exhibits a higher melting point than a solder connection, so that the bond formed according to the method of the invention has a wider range of application in instances where exposure to higher temperatures is required.

The bond formed between a copper body and ceramic substrate member according to the process of the invention, for example a ceramic substrate from AlN (aluminum nitride) is considerably better than the bonds formed by the known prior art methods.

In accordance with a preferred method according to the invention, prior to placing the ceramic member on the body of MMC-material, a second metal is provided at the surface of the MMC-body, which is placed adjacent the ceramic member. The ceramic member and the MMC-body are then heated above the eutectic temperature of a system formed of the matrix metal of the MMC-body, the first metal deposited on the surface of the ceramic member and the second metal deposited on the surface of the MMC-body, and subsequently cooled to room temperature.

By selecting and coordinating these three metals i. e. the first metal of the ceramic member, the second metal at the MMC-body and the matrix metal of the MMC-body in an optimum manner, a ternary eutectic system can be realized, which forms a particularly intimate bond between the ceramic member and the MMC-body.

According to one feature of the method according invention, the matrix metal of the MMC-body is aluminum or an aluminum alloy. Bond systems using this type of MMC-body are especially suitable for use as heat sinks due to their particularly good thermal conductivity.

According to another feature of the method according to the invention, the reinforcement material of the MMC-body is SiC. An MMC-body comprising this reinforcement material exhibits a particularly high mechanical strength. Especially in combination with an aluminum containing matrix metal, a good thermal conductivity is realized making the MMC-body suitable for forming a heat sink.

According to yet another feature of the method according to the invention, the surface of the ceramic member placed adjacent the MMC-body is coated with copper.

Furthermore, according to yet another feature, the surface of the MMC-body placed adjacent the ceramic member is coated with copper.

The MMC-body and the ceramic member are separated by three metals, i. e. the matrix metal of the MMC-body, the first metal on the surface of the ceramic member and the second metal on the surface of the MMC-body. The second metal, which is, located on the MMC-body suitably reacts with the first metal on the ceramic member, thereby forming a eutectic. At the same time an additional reaction takes place between the second metal of the MMC-body with the matrix metal of the MMC-body, also forming a eutectic. These bonds can then react further among each other, whereby optimally, a ternary eutectic is being formed. Copper is particularly suitable as a component in a variety of material combination in order to form such a ternary system, so that the use of copper is universally applicable in the method according to the invention.

It has been shown that coating the surface of the ceramic, which is placed adjacent the MMC-body, is advantageously carried out by means of the DBC-process. With this process, a particularly intimate bond of the copper layer to the ceramic member can be realized.

According to another feature of the invention, for bonding a copper body with a ceramic member, the surface of the ceramic member, which is placed adjacent the copper body is coated with aluminum, wherein in a further variation, a copper layer can be added to the aluminum layer, for example by means of an electrochemical method, preferably by a galvanic process.

At 548° C., aluminum and copper form a eutectic, so that by applying an aluminum coating to the ceramic member, pre-conditions for the correct reaction sequence of the method according to the invention are provided.

In accordance with yet another feature of the invention, the surface of the MMC-body that is placed adjacent the ceramic member, is coated with zinc, tin, germanium or similar material. These materials are especially suitable for completing a ternary system wherein an MMC-body of aluminum containing matrix metal and a copper coating exhibit a eutectic point.

In such a system, depositing the second metal at the surface of the MMC-body, which is placed adjacent the ceramic member, is carried out by means of a galvanic process. This coating process is well known, which is why it is suitable for controlling the good results that can be realized thereby.

Alternatively, the second metal which is deposited at the surface of the MMC-body placed adjacent the ceramic member is carried out by means of a current-free process, such as for example, by means of a tampon process. In this case the surface of the MMC-body is purposefully and selectively coated with metal.

As another alternative, the second metal can be provided at the surface of the MMC-body placed adjacent the ceramic member by depositing the second metal in the form of a metal foil. This type of process is technically especially simple because it requires only one tool for cutting the metal foil and requires no further installations, such as for example a galvanic bath or an oven or similar.

According to another feature of the process according to the invention, the MMC-body of the copper body and the ceramic member can be heated under normal atmospheric condition. Thus, the process according to the invention can be carried out with few resources. In particular, aside from providing heat for heating the two bodies, no special conditioning of the atmosphere in the oven is required.

Alternatively, the copper body and the ceramic member can also be heated in a protective gas atmosphere such as a nitrogen gas atmosphere, which has been proven particularly suitable. Furthermore, the MMC-body or the copper body can also be heated under a vacuum. While heating under a vacuum, there is virtually no oxygen surrounding the two bodies, so that no oxides are able to form in the bonding layer forming between the two bodies.

In a preferred embodiment of the method according to the invention, at least the MMC-body or the copper body, and in an even more preferred embodiment also the ceramic member are being held by graphite brackets during heating.

Graphite reacts with materials in its surrounding environment only at very high temperatures that are not reached during the process according to the invention, so that no compounds are being generated, which would negatively impact on the properties of the bond forming between the ceramic member and the MMC-body.

These aspects, and others which will become apparent hereinafter, are attained in accordance with the present invention by providing a method for attaching an MMC-body or a copper body, as a heat sink to a ceramic substrate such as a circuit board by depositing a first metal on the surface of a ceramic member, which is placed adjacent the metal matrix composite body; placing the surface of the ceramic member with the deposited first metal on the MMC-body; heating the two bodies to above a eutectic temperature for a system formed from the matrix metal of the MMC-body and the first metal deposited at the surface of the ceramic member; and subsequently cooling the system to room temperature.

BRIEF DESCRIPTION OF THE DRAWING

The above and other objects, features and advantages of the present invention will be more readily apparent upon reading the following description of a preferred exemplified embodiment of the invention with reference to the accompanying drawing, in which.

DETAILED DESCRIPTION OF PREFERRED EMBODIMENTS

Figure 1:
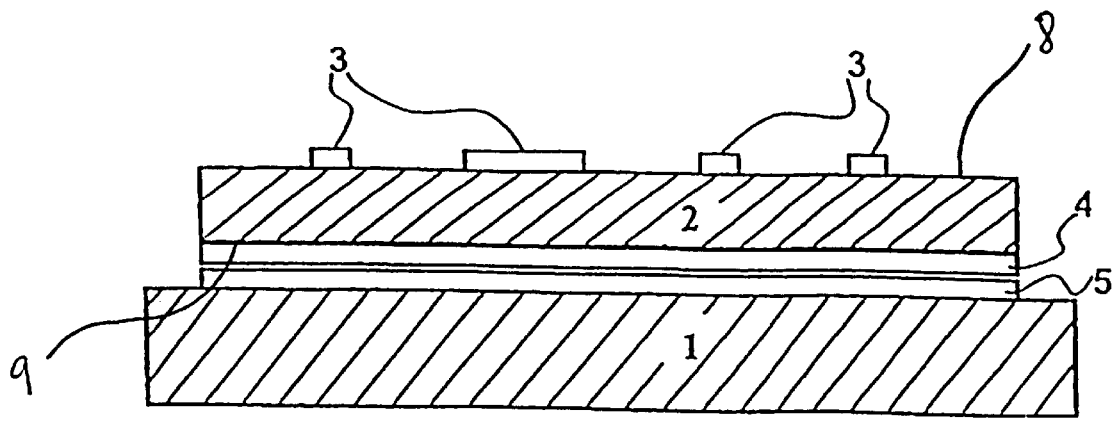
FIG. 1 is vertical section of a bond formed between a MMC-body 1 and ceramic member 2 in accordance with the method of the present invention.

Throughout all the Figures, same or corresponding elements are generally indicated by same reference numerals.

Turning now to the drawing, and in particular to FIG. 1, there is shown a body 1 of MMC-material, such as a MMC-body, which is a heat sink and the ceramic member 2, which is a circuit board having a surface 8, as in FIG. 1 of ceramic member 2 with the strip conductors 3 deposited thereon. The process according to the invention is herein described in reference to this preferred embodiment; however, other applications of the process according to the invention to carry out bonding between other bodies used for different functions are not precluded.

The strip conductors 3 are preferably deposited onto the substrate by means of the DCB process known from the prior art. When applying the DCB process, a $Cu/Cu_2O$-eutectic is being formed between the ceramic member and a copper foil by depositing oxygen onto one of these components, and through subsequent heating above the eutectic temperature of Cu and $Cu_2O$ whereby after cooling the so-formed $Cu/Cu_2O$-eutectic, the two components become bonded. The afore-described process for producing a copper-ceramic bond exploits the physical property of a $Cu/Cu_2O$-eutectic that has a very good wetting capacity for copper and ceramic, or respectively, that the eutectic, after is has been cooled, is particularly well adhering to ceramic and copper and thereby forming an intimate bond between the two components.

The surface 9 of the ceramic member 2 adjacent to the MMC-body 1 shown in FIG. 1 is coated with a first metal 4. Preferably copper is used as the first metal, of which the strip conductors 3 are also formed. The coating may be carried out by means of the DCB-process to thus realize a particularly intimate adherence to the ceramic member. Other metals may also be used instead of copper for forming the strip conductors 3 and/or for depositing the metal layer 4 on the surface 9 of the ceramic member 2. However, when using other metals, the coating step must then be carried out by another process, such as for example by vaporization, galvanization or similar. As will be explained further herein, the choice of the metal 4 for the coating can be coordinated with the choice of the matrix metal of the MMC-body 1 and the second metal 5 deposited on the surface of the MMC-body 1.

To carry out the method according to the invention, a precise composition of the ceramic member 2 is not essential. For example, the ceramic member 1 can be formed from compounds such as $AlTiO_3$, $SiAlO_xN_y$, AlN, BN, SiC, $Si_3N_4$ or $SiO_xN_y$. The precise sequence of the process and the parameters of the DCB-process for affixing the strip conductors 3 and the copper layer 4 onto the ceramic member 2 have to be chosen according to the substantive material that is being used. The parameters that apply for each of the named compounds or respectively, the precise sequence steps of the process are also known from the prior art.

The type of MMC-material used for the MMC-body 1 is also known from the prior art and has been described already in more detail in the introducing paragraphs, except to note, that carrying out the method according to the invention is not limited to a specific composition of the MMC-body 1. Except as further explained herein in connection with the coordination of the matrix metal with other metals that are used in the region of the border surface between the MMC-body 1 and the ceramic member 2, in principle, the components of the MMC-body 1 can be selected from a variety of materials. For example, the reinforcement material can be selected from compounds such as SiC, AlN, $AlTiO_3$, $SiAlO_xN_y$, BN, $Si_3N_4$, $SiO_xN_y$ or can be graphite. The matrix metal of the MMC-body 1 is preferably formed from aluminum or aluminum alloy. Use of the matrix metal is preferred in combination with a reinforcement material from SiC. Other matrix metals used are for example iron, nickel, magnesium, copper or similar ones, in addition to metal alloys.

The present invention is based on replacing the soldering process known and used in the prior art to connect the MMC-body 1 and the ceramic member 2, with a eutectic process in accordance with the invention. With the method according to the invention, a eutectic is formed between the MMC-body 1 and the ceramic member 2 by heating the two bodies 1 and 2, which on the one hand produces a good bond with the MMC-body 1, and on the other hand adheres well to the metal layer 4 which is attached to the ceramic member 2, thereby creating an intimate bond of the bodies 1 and 2.

A eutectic of this type is formed by using such metals as are present between the MMC-body 1 and the ceramic member 2. In the example seen in FIG. 1, this is embodied for example in the metal 4 at the bottom surface 9 of ceramic member 2.

By means of coordinating the two metals, the afore-stated eutectic can be formed, by which an intimate bond of the two bodies 1 and 2 with each other. Especially when the matrix metal of MMC-body 1 is aluminum and the metal 4 which is deposited onto the ceramic member 2 is copper, the afore-described bond can be realized without the deposit onto the MMC-body 1 of a second metal 5.

In accordance with a preferred embodiment of the invention, a second metal 5 is deposited to the surface of the MMC-body 1 placed against the ceramic member, such that between the MMC-body 1 and the ceramic member 2 a total of three metal layers are present, namely, the already described matrix metal of MMC-body 1, the first metal 4 deposited on the ceramic member 2 and a second metal 5 which is deposited on the MMC-body 1. The layer of metal 5 deposited on the MMC-body 1 should chosen as relatively thin, that is, in the range of approximately 1 μm to 10 μm.

The manner of depositing the second metal 5 onto the MMC-body 1 is not essential to the invention and can be carried out by various methods. Examples of such deposit methods are the galvanic deposit of metal 5 by means of a respective galvanic method, current-free methods, such for example the tampon method, or by a mechanical press-on or rub-on method to name a few. These methods lead to the coating of the second metal 5 onto the MMC-body 1, that is, the second metal 5 is bonded to the surface of the MMC-body 1. It is also possible, to deposit the second metal 5 in the form of a foil from metal 5 onto the MMC-body 1. In this variation, three metals are present between the MMC-body 1 and the ceramic member 2, namely, the matrix metal of MMC-body 1, metal 4 deposited on the ceramic member 2 and second metal 5 deposited on MMC-body 1. In this arrangement, second metal 5 on MMC-body 1 and first metal 4 at ceramic member 2 can react with each other, thereby forming a eutectic. At the same time, the second metal 5 also reacts with the matrix metal of the MMC-body 1, whereby a eutectic is likewise formed. These bonds can further react with each other. Optimally, a ternary eutectic is formed, which provides an intimate bond between the two bodies 1 and 2.

Examples for metal combinations that form a eutectic among each other and which are thus suitable for the formation of bonds of the three metals between the MMC-body 1 and the ceramic member 2 are listed in the following table.

between the MMC-body 1 and the ceramic member 2: aluminum, copper (affixed to the ceramic member 2) and copper (affixed to the MMC-body 1). At 548° C. the aluminum and copper (affixed to the MMC-body 1) form a eutectic, which reacts with the copper affixed to the ceramic member 2 creating an intimate bond therewith, and thereby bonding the MMC-body 1 to the ceramic member 2. Since metal 4, which is affixed to ceramic member 2, is also copper, the eutectic temperature will not be lowered to below 548° C. by the presence of that copper layer.

The two bodies 1 and 2 are placed onto each other as shown in FIG. 1 and heated in an oven to at least the eutectic temperature of 548° C. and subsequently cooled. The said heating is carried out under a protective nitrogen gas atmosphere. During the process, the MMC-body 1 is held by graphite brackets. The ceramic member 2 can similarly be held by such brackets.

In further experiments that were conducted, the second metal 5 deposited to the MMC-body 1 was replaced first by zinc then by tin and finally by germanium, all other working material remained the same. When using these materials other than copper, a ternary system having a eutectic point is present in the area of the bordering surfaces between the bodies 1 and 2. The temperature, at which the eutectic forms, was lower (compare also the foregoing table) by using, respectively, zinc, tin and germanium than the eutectic

TABLE 1

| Variations | Al—Cu | Al—Ge | Al—Zn | Al—Sn | Al—Au | Al—Ag | Cu—Ag | Cu—Ge | Cu—Au | Cu—Zn | Cu—Sn |
|---|---|---|---|---|---|---|---|---|---|---|---|
| Eutectic Temperature (° C.) | 548 | 424 | 382 | 232 | 524 545 | 566 | 779 | 640 | 880 | 419 | 232 |

After the second metal 5 has been deposited on the MMC-body 1, the ceramic member 2 is placed on the MMC-body 1 and the two bodies then heated such that the three afore-described metals which form a system are first heated above the eutectic temperature and are subsequently cooled to room temperature.

If the metals were selected so that they form a ternary system with a common eutectic point, then by heating, a ternary eutectic will be formed between the MMC-body 1 and the ceramic member 2, whereby after cooling, an intimate bond has been formed between the two bodies 1 and 2.

If only two of the metals are able to form a eutectic, then that eutectic comprising the two metals was formed while heating and this eutectic has intimately bonded with the third metal.

The step of heating the two bodies 1 and 2 necessary to form the eutectic, can be carried out in a normal atmosphere, or under a protective gas atmosphere, for example under a nitrogen or argon atmosphere, or under a vacuum.

The following is presented as examples and without limiting the invention:

The MMC-body 1 is a so-called AlSiC bond, with a matrix metal from aluminum and its reinforcement material if from SiC. The surface of the ceramic member 2 formed of $Al_2O_3$, which is resting against the MMC-body 1 is coated with copper by means of the DCB-process. A metal layer also of copper is deposited at the surface of the MMC-body 1 placed against the ceramic member 2, by means of a galvanic process. Thus, the following metals are present temperature of aluminum and copper (548° C.), correspondingly less heat needed to be supplied to the system.

Figure 2:
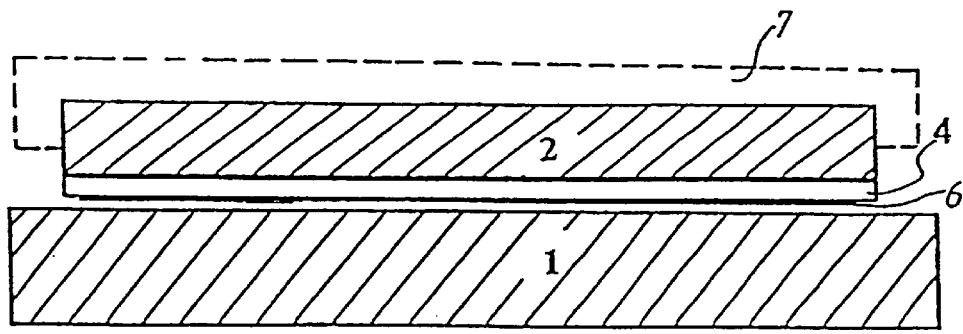
FIG. 2 is a vertical section of a bond formed between a copper-body and a ceramic member.

In FIG. 2, a body 1, which is of copper and a ceramic member 2 are shown, which are bonded by means of the process according to the present invention. The term "copper-body 1" defines a solid body of relative large thickness and also defines a relatively thin copper-body which can also be copper foil.

The object of the bond of such a copper-body 1 with a ceramic member 2 again is to form a eutectic between the two bodies 1 and 2, so that after cooling they are well connected forming an intimate bond between the two bodies 1 and 2.

The metal 4, which is deposited on the ceramic member 2, must be of the type that forms a eutectic with the copper of the copper-body. It has been shown that aluminum is advantageously used which, as already stated, forms a eutectic at 548° C. The method for depositing the metal 4 is not an essential part of the invention and can be selected by choice. However, the chosen method should be such that a metal layer 4 can be well affixed to the ceramic member 2. For example, when using a ceramic member 2 of aluminum nitride, a favorable result has been realized when depositing the aluminum layer by means of a pressure die casting process.

As a preferred method, the aluminum layer is deposited by means of gas pressure infiltration onto the ceramic member 2. The term "gas pressure infiltration" in the context of the present invention defines a process in which aluminum is liquefied by heating it above its melting point and then pouring it onto the ceramic member 2, and subjecting it to pressure by raising the atmospheric pressure.

Due to the dense consistency of the ceramic member 2, the aluminum does not penetrate the ceramic member 2 but forms an aluminum layer at the surface of the ceramic member 2. The afore-described gas pressure is produced by compression of the normal air atmosphere or by means of supplying a gas other than normal air, for example, an inert gas such as nitrogen ($N_2$) to the pressure chamber in which the gas pressure infiltration process is carried out. The extent of the pressure to be applied is selected so that an intimate affixation of the aluminum layer on the ceramic member 2 can be realized. By way of example only, pressure values can be in the range between 60 bar to 140 bar, preferably 60 bar to 80 bar, as a most preferred range, about 70 bar is proposed.

In another embodiment, the ceramic member 2 is integrated into a unit 7 as shown in FIG. 2 by the broken lines. A bond that comprises an MMC-unit 7 and a ceramic member 2 integrated therein is produced by placing the porous reinforcement material of the MMC-unit 7 into a casting mold and the ceramic member 2 is deposited onto the reinforcement material. Subsequently, aluminum is melted and placed into the casting mold. By generating a suitably elevated pressure (for example by producing an excess gas pressure in the casting mold atmosphere or by means of a mechanical pressure ram), the aluminum is not only pressed into the pores of the reinforcement material (infiltration of the reinforcement material) but is also cast around the ceramic member 2. With this method, the ceramic member 2 becomes bonded with the MMC-unit 7 being formed and also becomes coated with an aluminum layer 4 which is required for the method according to the invention.

Instead of the pressure casting method or the gas pressure infiltration, a hot pressure method may also be used, wherein at elevated temperature an aluminum foil is pressed by means of a pressure ram onto the surface of the ceramic member 2. An aluminum layer, which is being deposited by means of a process which includes melting the aluminum and pouring it onto the ceramic member 2, should be kept rather thin due to the large differences in expansion coefficients between the ceramic member 2 and the aluminum. Since the aluminum goes from the molten-liquid phase to the solid phase and the bonding takes place at the upper temperature range, an aluminum layer which is too thick causes strong tension on the transition layer between the ceramic and aluminum, so that when larger areas are involved, fractures occur in the ceramic. The aluminum layer should thus be kept in the range of 10 $\mu$m and 100 $\mu$m in order to prevent the afore-described problem.

After the metal 4 has been deposited onto the ceramic member 2, the ceramic member 2 is placed onto the copper-body 1 and the two bodies 1 and 2 heated above the eutectic temperature of the system formed of the copper of the copper-body and the metal 4 deposited on the surface of the ceramic member 2 and subsequently cooled to room temperature. As a result, a Cu—Al-eutectic is realized, which intimately bonds the two bodies 1 and 2.

Prior to putting the bodies 1 and 2 together and heating them, a thin copper layer 6 can be deposited on the metal 4 of the ceramic member 2, for example by means of a galvanic method. This has a similar effect as in the afore-described example where the bond is formed of the MMC-body 1 with the ceramic member 2, and the copper layer forms a eutectic with the aluminum layer, which reacts with the copper of the copper-body 1 and forming an intimate bond thereby.

While the invention has been illustrated and described as embodied in a ceramic member and an MMC-body or a copper-body, it is not intended to be limited to the details shown since various modifications and structural changes may be made without departing in any way from the spirit of the present invention.

What is claimed as new and desired to be protected by Letters Patent is set forth in the appended claims:

1. A method for attaching a metal matrix composite (MMC) body to a ceramic member, comprising the steps of:

coating a first metal on a surface of the ceramic member;

placing the ceramic member with the metal-coated surface upon the MMC body;

heating the MMC body and the ceramic member to a temperature above an eutectic temperature of the eutectic system defined by the matrix metal of the MMC-body and the first metal applied on the surface of the ceramic member; and cooling the system to room temperature.

2. The method of claim 1, wherein the ceramic member is a ceramic circuit board.

3. The method of claim 1 wherein the metal matrix composite is a heat sink.

4. The method of claim 1, wherein the MMC body has to a surface facing the metal-coated surface of the ceramic member, and further comprising the step of depositing a second metal on the surface of the MMC-body before the ceramic member is placed on the MMC-body, thereby defining the eutectic system to comprise the matrix metal of the MMC-body, the first metal applied on the surface of the ceramic member and the second metal applied on the surface of the MMC-body.

5. The method of claim 1, wherein the MMC-body includes a matrix metal selected from the group consisting of aluminum and aluminum alloy.

6. The method of claim 1, wherein the MMC body includes a reinforcement material in the form of ceramic material.

7. The method of claim 6, wherein the ceramic material is SiC.

8. The method of claim 1, wherein the first metal is copper.

9. The method of claim 8, wherein the copper is coated onto the surface of the ceramic member by a direct-copper-bonding process.

10. The method of claim 1, wherein the first metal is aluminum.

11. The method of claim 10, and further comprising the step of depositing a layer of copper on the aluminum coating by an electrochemical process.

12. The method of claim 11, wherein the electrochemical process is a galvanic process.

13. The method of claim 4, wherein the second metal deposited on the MMC-body is copper.

14. The method of claim 4, wherein the second metal deposited on the MMC-body is selected from the group consisting of zinc, tin and germanium.

15. The method of claim 4, wherein the second metal is deposited on the MMC-body by a galvanic process.

16. The method of claim 4, wherein the second metal is deposited on the MMC-body by a current-free process.

17. The method of claim 16, wherein the current-free process is a tampon process.

18. The method of claim 4, wherein the second metal is deposited on the MMC-body in the form of a foil.

19. The method of claim 1, wherein the heating step is carried out under normal air atmosphere.

20. The method of claim 1, wherein the heating step is carried out under a protective gas atmosphere.

21. The method of claim 20, wherein the protective gas atmosphere is formed by nitrogen or argon.

22. The method of claim 1, wherein the heating step is carried out under a vacuum.

23. The method of claim 1, wherein the heating step is carried out while at least the MMC body is supported by graphite brackets.

24. The method of claim 1, wherein the heating step is carried out while the MMC body and the ceramic member are supported by graphite brackets.

25. The method of claim 1, wherein the MMC body includes copper.

* * * * *